United States Patent
Kim

(10) Patent No.: US 7,913,134 B2
(45) Date of Patent: Mar. 22, 2011

(54) TEST CIRCUIT CAPABLE OF SEQUENTIALLY PERFORMING BOUNDARY SCAN TEST AND TEST METHOD THEREOF

(75) Inventor: Young-Ju Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 202 days.

(21) Appl. No.: 12/172,894

(22) Filed: Jul. 14, 2008

(65) Prior Publication Data

US 2009/0150731 A1    Jun. 11, 2009

(30) Foreign Application Priority Data

Dec. 11, 2007   (KR) .................. 10-2007-0128298

(51) Int. Cl.
    *G01R 31/28* (2006.01)
(52) U.S. Cl. ...................................... 714/727
(58) Field of Classification Search .......... 714/727, 714/726
    See application file for complete search history.

(56) References Cited

U.S. PATENT DOCUMENTS

| | | | | |
|---|---|---|---|---|
| 4,697,095 A * | 9/1987 | Fujii | ............................ | 327/408 |
| 4,703,483 A * | 10/1987 | Enomoto et al. | .............. | 714/735 |
| 6,286,119 B1 * | 9/2001 | Wu et al. | ...................... | 714/726 |
| 6,408,414 B1 | 6/2002 | Hatada | | |
| 6,456,101 B2 * | 9/2002 | Dumbri | ........................ | 324/763 |
| 6,489,791 B1 * | 12/2002 | Tsujii | ............................ | 324/755 |
| 6,535,049 B2 * | 3/2003 | Jaynes et al. | .................. | 327/407 |
| 6,711,708 B1 | 3/2004 | Shimomura | | |
| 6,988,228 B2 * | 1/2006 | Paglieri | ........................ | 714/726 |
| 7,020,819 B2 | 3/2006 | Shin | | |
| 7,107,504 B2 * | 9/2006 | Sato et al. | ..................... | 714/733 |
| 7,263,679 B2 | 8/2007 | Kuge et al. | | |
| 7,281,182 B2 * | 10/2007 | Gillis et al. | ................... | 714/726 |
| 7,400,134 B2 * | 7/2008 | Morishita et al. | .......... | 324/158.1 |
| 7,480,843 B1 * | 1/2009 | Jacobson | ..................... | 714/725 |
| 7,526,698 B2 * | 4/2009 | Dalton et al. | ................. | 714/733 |
| 7,610,528 B2 * | 10/2009 | Laurent et al. | ................ | 714/724 |
| 7,631,231 B2 * | 12/2009 | Nguyen et al. | ............... | 714/718 |
| 7,707,467 B2 * | 4/2010 | Louie et al. | ................... | 714/718 |

FOREIGN PATENT DOCUMENTS

| | | |
|---|---|---|
| JP | 2002-031667 | 1/2002 |
| KR | 1019990040008 | 6/1999 |
| KR | 1019990047437 | 7/1999 |

* cited by examiner

*Primary Examiner* — James C Kerveros
(74) *Attorney, Agent, or Firm* — Baker & McKenzie LLP

(57) ABSTRACT

A boundary scan test circuit is capable of sequentially performing a boundary scan test with respect to semiconductor integrated circuits bonded to both surfaces of a memory board. In order to reduce a boundary scan test time, the boundary scan test circuit includes a mirror function unit which transmits data signals of a first group pin or data signals of a second group pin corresponding to the first group pin according to a mirror function enable signal, and a boundary scan test unit which receives the data signals of the mirror function unit to perform a boundary scan test.

8 Claims, 5 Drawing Sheets

TEST CIRCUIT CAPABLE OF SEQUENTIALLY PERFORMING BOUNDARY SCAN TEST AND TEST METHOD THEREOF

CROSS-REFERENCES TO RELATED APPLICATION

The present application claims priority under 35 U.S.C. 119(a) to Korean application number 10-2007-0128298, filed in the Korean Intellectual Property Office on Dec. 11, 2007, which is incorporated by reference in its entirety as if set forth in full.

BACKGROUND

1. Technical Field

The embodiments described herein relate to a semiconductor integrated circuit, and more particularly, to a boundary scan test circuit and a test method thereof.

2. Related Art

A conventional boundary scan test checks the bonding state between semiconductor integrated circuits, such as, Dynamic Random Access Memories (DRAMs), which have already been mounted to a memory board, as well as the memory board.

The, e.g., DRAMs are often bonded and mounted onto two opposite surfaces of the memory board to form a module, which can then be packaged to form a device that will be referred to hereafter as a "chip". One of the two surfaces of the memory board can be called a "top", and the other surface can be called a "bottom." Chips mounted on the top and bottom surfaces of the memory board are electrically connected to interconnections of the memory board.

The semiconductor chips mounted on the memory board can be electrically connected to the memory board through external connection terminals such as pins. The external connection terminals may perform different functions. The external connection terminals may be connected to each other through the same line, so that the semiconductor chips mounted on the top and bottom surfaces of the memory board cannot be subject to a boundary scan test in the same scheme (sequence).

Hereinafter, a typical boundary scan test circuit 10 will be described with reference to FIG. 1. The boundary scan test circuit 10 includes a first latch unit 3-1 to an $N^{th}$ latch unit 3-N, and a first flip-flop 4-1 to an $N^{th}$ flip-flop 4-N.

Referring to FIG. 2, when a scan enable signal 'SEN' becomes a high level, a boundary scan test is started. When a control signal 'SSH' is a low level, the first to $N^{th}$ latch units 3-1 to 3-N transmit output data signals received from a plurality of pins DM0, DQ5, DQ4, . . . , and RDQ0 to the first to $N^{th}$ flip-flops 4-1 to 4-N. Accordingly, the first flip-flop 4-1 to the $N^{th}$ flip-flop 4-N receive the output data signals from a plurality of pins DM0, DQ5, DQ4, . . . , and RDQ0. When a clock signal 'SCK' is enabled, the first flip-flop 4-1 to the $N^{th}$ flip-flop 4-N store and output the received output data signals. However, in this case, since an output enable signal 'SOE#' is disabled at a high level, the data of the $N^{th}$ flip-flop 4-N is not output as a scan output signal 'SOUT'.

FIG. 3 is a timing chart showing that the first flip-flop 4-1 to the Nth flip-flop 4-N sequentially outputs data, received on a plurality of pins DM0, DQ5, DQ4, . . . , and RDQ0, as the scan output signal 'SOUT'.

Whenever the clock signal 'SCK' is enabled, the first flip-flop 4-1 to the $N^{th}$ flip-flop 4-N are driven, so that the output data of the first to $(N-1)^{th}$ latch units 3-1 to 3-(N-1) are sequentially transmitted. When the output enable signal 'SOE#' is enabled at a low level, a data signal is output from the lowest pin RDQ0.

FIG. 4 is a schematic view showing the connection state of pins of top and bottom chips installed on both surfaces of a memory board.

Referring to FIG. 4, a signal 'CS' is applied to the top chip and a signal 'CAS' is applied to the bottom chip through the same line. In addition, the signal 'CAS' is applied to the top chip and the signal 'CS' is applied to the bottom chip through the same line. Further, signal 'WDQS0' is applied to the top chip and signal 'WDQS1' is applied to the bottom chip through the same line. Thus, as described above, signals for different functions are applied to pins of the top and bottom chips through the same line. Although it is not shown, in addition to signals 'CS,' 'CAS,' 'WDQS0,' and 'WDQS1' a plurality of signals exist that are applied to the top and bottom chip, in some instances at least through the same line.

Accordingly, if the boundary scan test is performed by inputting data signals, according to the sequence of pins of the top chip, signals different from those applied to the top chip are input to the bottom chip, so that the data signal output sequence of the bottom chip is different than the data signal output sequence of the top chip. In order to achieve an identical data signal output sequence of the bottom chip as that from the data signal output sequence of the top chip, an additional test program or another test scheme must be used which may result in an increased test time.

SUMMARY

A boundary scan test circuit and a test method thereof, capable of sequentially performing a boundary scan test with respect to semiconductor integrated circuits bonded to both surfaces of a memory board is described herein.

According to one aspect, the boundary scan test circuit includes a mirror function unit configured to output data of a first group of pins of a bottom chip or data of a second group of pins of the bottom chip according to a mirror function enable signal, and a boundary scan test unit configured to receive data of the mirror function unit to perform a boundary scan test for the bottom chip in a sequence of a boundary scan test for the top chip.

According to another aspect, a boundary scan test method for a semiconductor integrated circuit including a top chip and a bottom chip mounted on both surfaces of a memory board comprises the steps of performing a boundary scan test for the top chip by sequentially testing the output data signals of a third group of pins of the top chip, as a mirror function enable signal is disabled, and performing a boundary scan test for the bottom chip by sequentially testing the output data signals of a second group of pins corresponding to a first group of pins of the bottom chip, as the mirror function enable signal is enabled.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 5:
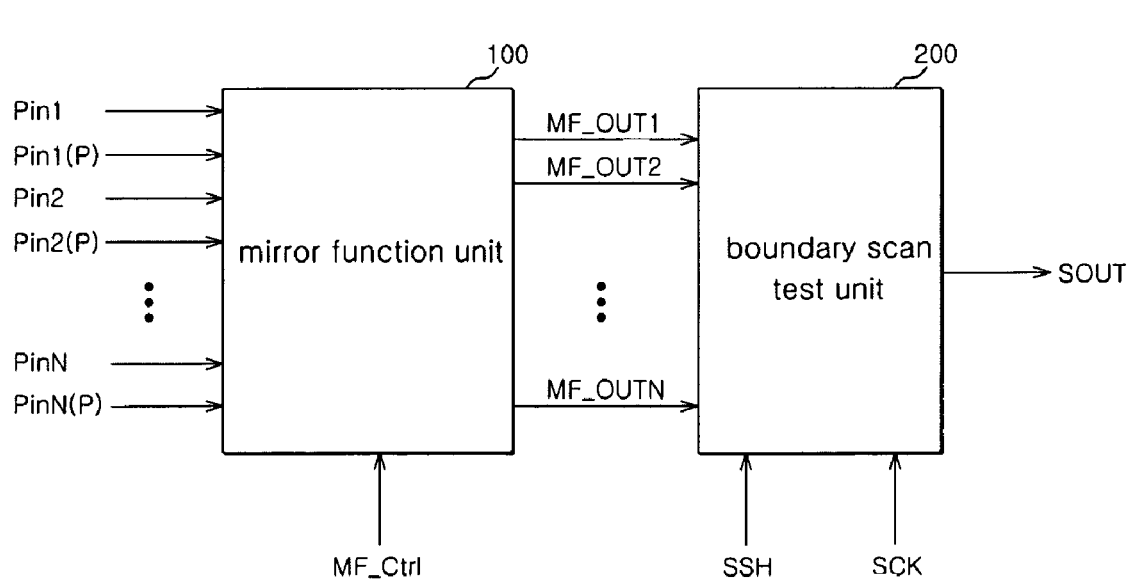
FIG. 5 is a block diagram showing a boundary scan test circuit according to one embodiment.

FIG. 5, is a diagram illustrating boundary scan test circuit 1000 in accordance with one embodiment. As can be seen, circuit 1000 can include a mirror function unit 100 and a boundary scan test unit 200. In certain embodiments, the boundary scan test circuit 1000 can be used to perform a boundary test scan on a module comprising a top chip and a bottom chip, which are coupled with either side of a circuit board as described above.

The bottom chip can comprise a first group of pins Pin<1:N> and the top chip can comprise a third group of pins. The first group of pins can include a sub group, or second group of pins that are connected with certain pins of the top chip, i.e., the third group of pins. Similarly, the third group of pins can comprise a sub group, or a fourth group of pins that are connected with certain pins of the bottom chip, i.e., the first group of pins. These pins can be used to receive or output data from an external circuit such as a central processing unit (CPU) or a graphic processing unit (GPU)

When performing a boundary test scan on the bottom chip, the mirror function unit 100 can be configured to transmit a first plurality of signals 'Pin<1:N>' corresponding to the first group of pins Pin<1:N> of the bottom chip or a second plurality of signals 'Pin<1(P):N(P)>' corresponding to the second group of pins Pin<1(P):N(P)> of the bottom chip, according to a mirror function enable signal 'MF_Ctrl.'

The second group of pins Pin<1(P):N(P)> can be used to input/output data signals, having the same functions as those of a third group of pins of the top chip, which are connected with the first group of pins Pin<1:N> through the same lines on a memory board. For example, as with the circuit illustrated in FIG. 4, the first group of pins can be connected with a third group of pins of the top chip through the same lines via the memory board. Further, a CAS pin can belong to the first group of pins of the bottom chip, and a CS pin can belong to the third group pins of the top chip. Similarly, a CAS pin can belong to the third group of pins of the top chip, and a CS pin can belong to the first group pins of the bottom chip. Each of these pins can then be connected to the same line via the circuit board.

The boundary scan test unit 200 can be used to receive output data signals 'MF_OUT1' to 'MF_OUTN' of the mirror function unit 100 and can be used to perform a boundary scan test.

In a conventional boundary scan test circuit, although certain pins of the top and bottom chips mounted on the memory board are connected to each other through the same interconnections, pins connected to the top and bottom chips can receive/output data signals that differ from each other. Accordingly, in terms of sequence, the boundary scan test scheme for the top chip can be different from the boundary scan test scheme for the bottom chip. To overcome this issue, a boundary scan test as described herein can be performed based on the outputs of mirror pins such that the boundary scan test for the bottom chip can be performed in accordance with the pin sequence of the top chip. Therefore, the boundary scan test circuit described herein can perform a mirror function in a boundary scan test if the mirror function enable signal 'MF_Ctrl' is enabled.

Accordingly, when performing a boundary scan test for the bottom chip, a boundary scan test circuit configured as described herein can receive signals from the second group of pins.

Figure 6:
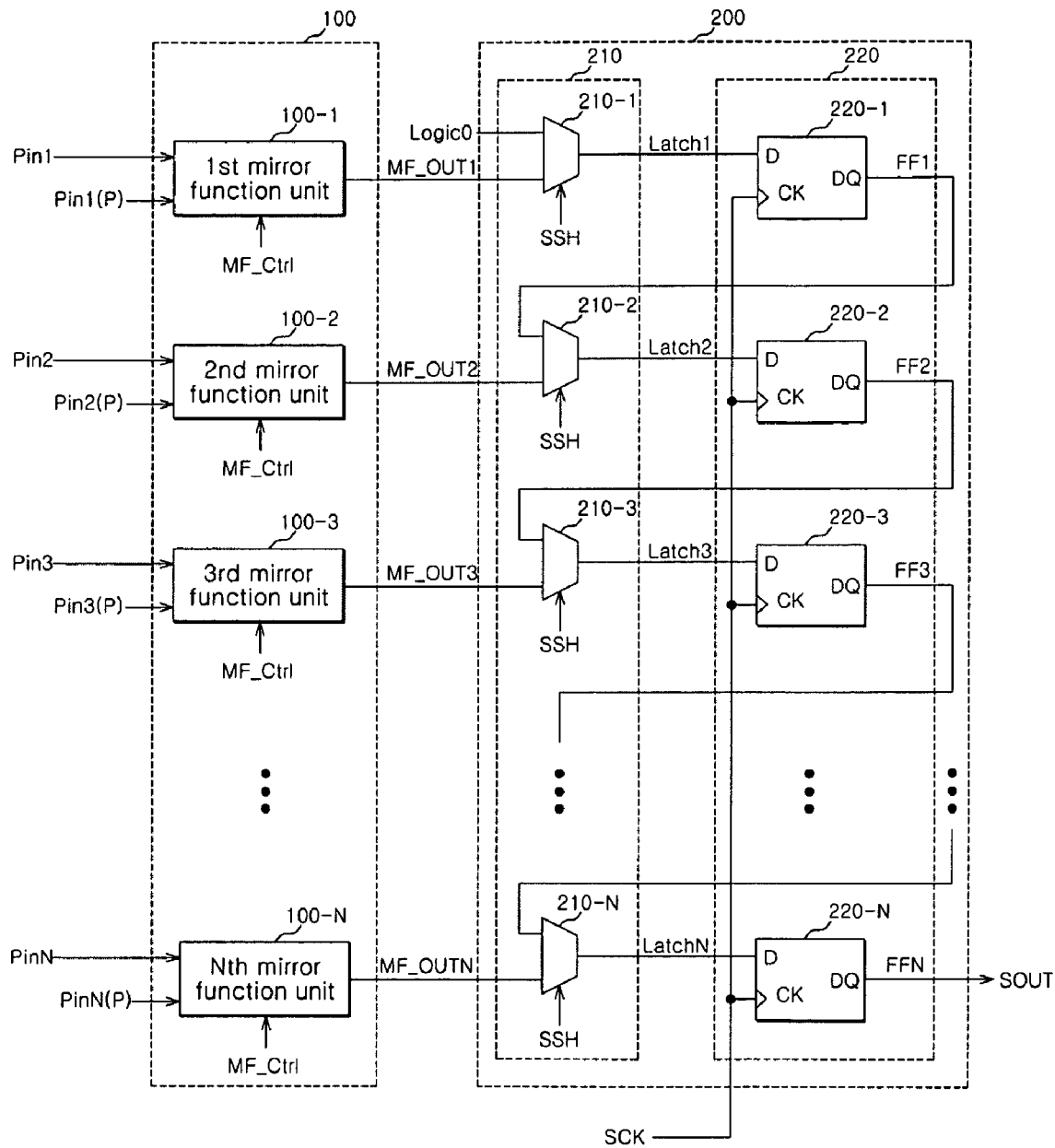
FIG. 6 is a detailed circuit diagram showing the boundary scan test circuit shown in FIG. 5 according to one embodiment.

In more detail, referring to FIG. 6, the first group of pins Pin<1:N> includes a first pin Pin<1> to an $N^{th}$ pin Pin<N>, and the second group of pins Pin<1(P):N(P)> includes a first pin Pin<1(P)> to an $N^{th}$ Pin<N(P)>.

The mirror function unit 100 can include a first mirror function unit 100-1 to an $N^{th}$ mirror function unit 100-N. The $N^{th}$ mirror function unit 100-N can be configured to output one of the output data signal of the $N^{th}$ pin PinN of the first group of pins and the output data signal of the Nth mirror pin PinN(P) of the second group of pins corresponding to the $N^{th}$ pin Pinn and according to the mirror function enable signal 'MF_Ctrl.'

The boundary scan test unit 200 can include a latch unit 210 and a transmission unit 220. The latch unit 210 can receive, latch, and output the output data signals of the mirror function unit 100 and the transmission unit 220 according to a control signal 'SSH'. The latch unit 210 can include a first latch unit 210-1 to an $N^{th}$ latch unit 210-N.

The transmission unit 220 can include a first flip-flop 220-1 to an Nth flip-flop 220-N corresponding with the first latch unit 210-1 to an $N^{th}$ latch unit 210-N.

Figure 1:
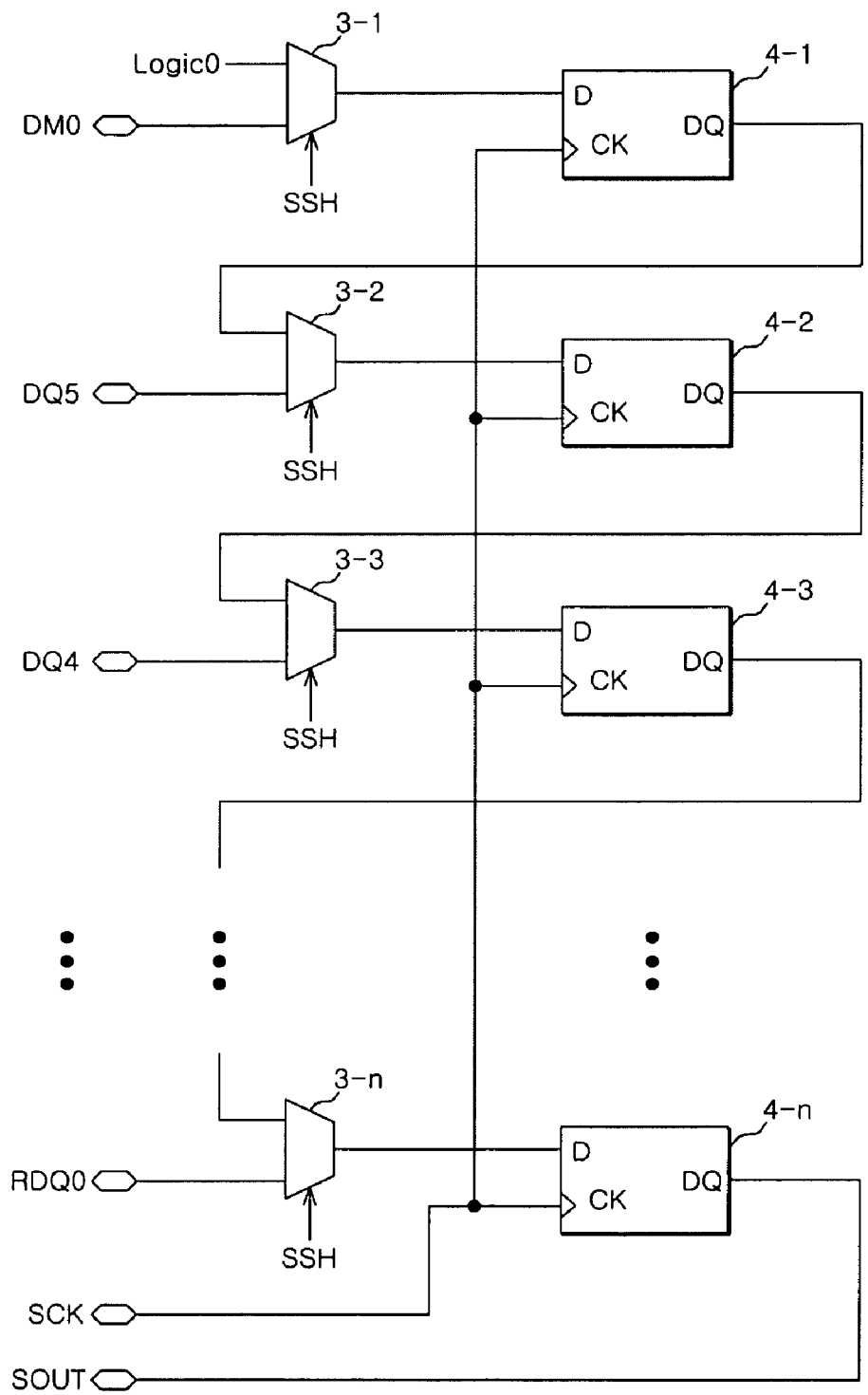
FIG. 1 is a circuit diagram showing a conventional boundary scan test circuit.
Figure 2:
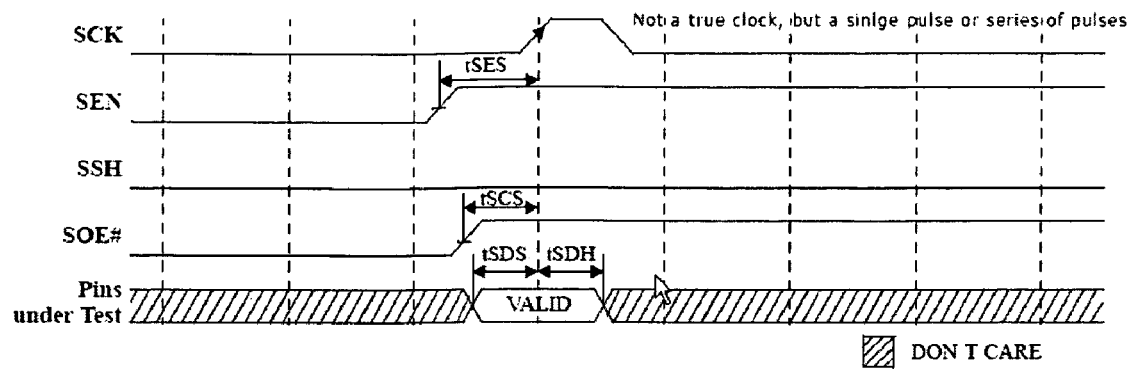
FIG. 2 is a timing diagram illustrating the input data scan of the boundary scan test circuit shown in FIG. 1.
Figure 3:
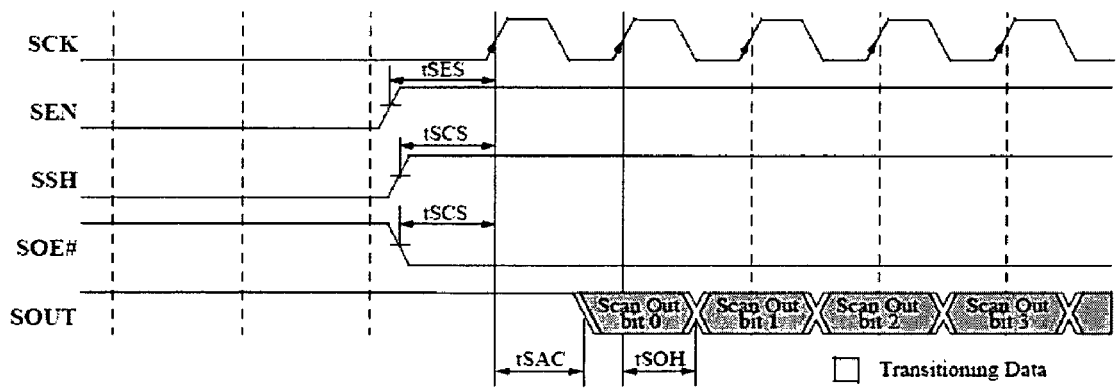
FIG. 3 is a timing diagram illustrating the data output of the boundary scan test circuit shown in FIG. 1.
Figure 4:
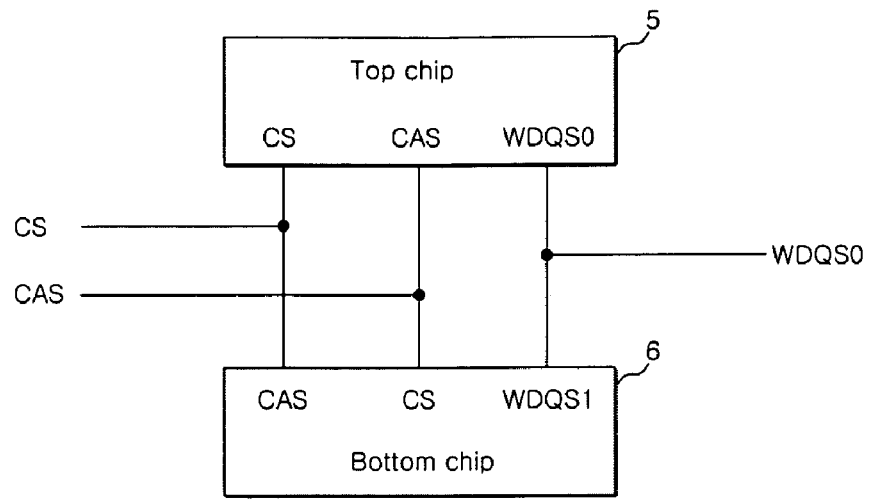
FIG. 4 is a diagram showing the connection state of pins of top and bottom chips bonded to a memory board.

The latch unit 210-1 can receive a low-level signal 'Logic0' and output data signal 'MF_OUT1' of the first mirror function unit 100-1 according to the control signal 'SSH'. The control signal 'SSH' can be used to selectively output the input signals of the first to $N^{th}$ latch units 210-1 to 210-N. For example, if the CAS pin of the bottom chip shown in FIG. 4 is the first pin, the CS pin of the bottom chip may be the first mirror pin.

In addition, the $N^{th}$ latch unit 210-N can receive output data FF(N−1) of the $(N-1)^{th}$ flip-flop 220-(N−1) and output data signal 'MF_OUTN' of the $N^{th}$ mirror function unit 100-N according to the control signal 'SSH'. For example, the third latch unit 210-2 can receive output data signal 'FF1' of the first flip-flop 220-1 and output data signal 'MF_OUT2' of the second mirror function unit 100-2 according to the control signal 'SSH'. The third latch unit 210-3 can receive output data signal 'FF2' of the second flip-flop 220-2 and output data signal 'MF_OUT3' of the third mirror function unit 100-3 according to the control signal 'SSH'. Accordingly, the $N^{th}$ latch unit 210-N can receive output data signal 'FF(N−1)' of the $(N-1)^{th}$ flip-flop 220-(N−1) and output data signal 'MF_OUTN' of the $N^{th}$ mirror function unit 100-N according to the control signal 'SSH'.

The $N^{th}$ flip-flop 220-N can receive the data signal of the $N^{th}$ latch unit 210-N. In addition, the data signal of the $N^{th}$ flip-flop 220 are input to the $(N+1)^{th}$ latch unit 210-(N+1). The first flip-flop 220-1 can receive the data signal of the first latch unit 210-1 and output the data signal of the first latch unit 210-1 to the second latch unit 210-2 in synchronization with a clock signal 'SCK'. The second flip-flop 220-2 can receive the data signal of the second latch unit 210-2 and output the data signal of the second latch unit 210-2 to the third latch unit 210-3 in synchronization with the clock signal 'SCK'. The third flip-flop 220-3 can receive the data signal of the third latch unit 210-3 and output the data signal of the third latch unit 210-3 to the fourth latch unit 210-4 in synchronization with the clock signal 'SCK'. The data signal of the $N^{th}$ flip-flop 220-N can be output as a scan output signal 'SOUT'.

Referring still to FIG. 6, the mirror function enable signal 'MF_CTrl' is enabled, so that the first function unit 100-1 to the $N^{th}$ mirror function unit 100-N output the data signals of the mirror pins Pin<1(P):N(P)> selected among output data signals of the pins Pin<1:N> and the output data signals of the mirror pins Pin<1(P):N(P)>. If the control signal 'SSH' becomes a low level, then the latch unit 210 transmits the output data signals of the mirror function unit 100, which are selected from the output data signals of the mirror function unit 100 and the transmission unit 220 of a previous stage, to the corresponding part of the transmission unit 220.

As the clock signal 'SCK' is enabled, the data of the latch unit 210 are stored in the first flip-flop 220-1 to the $N^{th}$ flip-flop 220-N of the transmission unit 220 and then output. Accordingly, the $N^{th}$ flip-flop 220-N transmits the output data signal of the $N^{th}$ latch unit 210, which have been received therein from the $N^{th}$ mirror pin Pin<N(P)>, as the scan output signal 'SOUT'. If the control signal 'SSH' becomes a high level, the first latch unit 210-1 to the $N^{th}$ latch unit 210-N latch and output the data signals of flip-flops, provided in the previous stage, instead of the output data signals of the mirror function unit 100. Accordingly, when the clock signal 'SCK' is enabled, the data signals of the flip-flops, provided in the previous stage, are stored and output. As a result, the $N^{th}$ flip-flop 220-N outputs a signal which has been stored in the $(N-1)^{th}$ flip-flop 220-N-1 and then transmitted through the $N^{th}$ latch unit. In other words, the output signal 'FFN' of the $N^{th}$ flip-flop 220-N has been transmitted from the $(N-1)^{th}$ mirror pin PinN-1(P). In other words, whenever the clock signal 'SCK' is enabled, output data of the $N^{th}$ flip-flop 'FFN' is sequentially transmitted as the scan output signal 'SOUT'.

Accordingly, since a boundary scan test for the bottom chip can be performed in a test sequence identical to that of the top chip, the boundary scan test can be easily carried out, and test and analysis time can be reduced.

Figure 7:
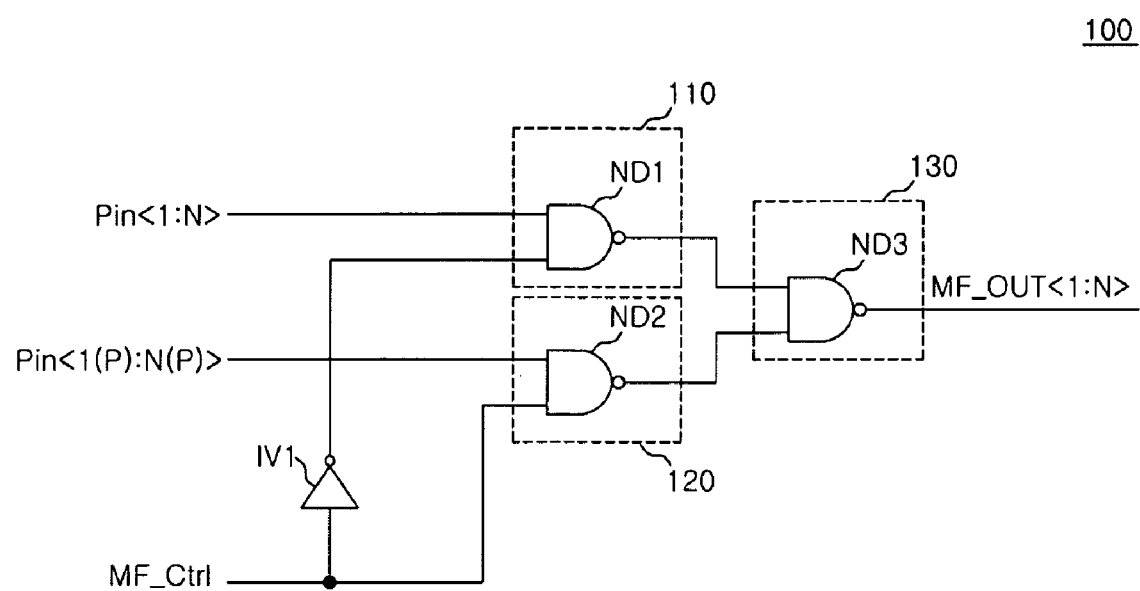
FIG. 7 is a detailed circuit diagram showing a mirror function unit that can be included in the circuit shown in FIG. 5 according to one embodiment.

In FIG. 7, the mirror function unit 100 can include a first decoding unit 110, a second decoding unit 120, and a third decoding unit 130.

A mirror function unit 100 can be provided for each pin. If the number of the pins is N, N mirror function units 100 are provided.

The first decoding unit 110 can be configured to receive an inverted signal of the mirror function enable signal 'MF_Ctrl' and output signals of the pins Pin<1:N>. The first decoding unit 110 can be realized by using a first NAND gate ND1 to receive the inverted signal of the mirror function enable signal 'MF_Ctrl' and the output signals of the pins Pin<1:N>. The inverted signal of the mirror function enable signal 'MF_Ctrl' can be obtained by a first inverter IV1 receiving the mirror function enable signal 'MF_Ctrl.'

The second decoding unit 120 can be configured to receive the mirror function enable signal 'MF_Ctrl' and the output signals of pins Pin<1:N>. The second decoding unit 120 can be realized by using a second NAND gate to receive the mirror function enable signal 'MF_Ctrl' and the outputs of the pins Pin<1:N>.

The third decoding unit 130 can be configured to receive the output of the first decoding unit 110 and the output of the second decoding unit 120 and perform an operation. The third decoding unit 130 can be realized by using a third NAND gate ND3 to receive the output signal of the first decoding unit 110 and the output signal of the second decoding unit 120.

In order to perform the mirror function in a chip, comprising of the boundary scan test circuit, the mirror function enable signal 'MF_Ctrl' becomes a high level, and the output signal of the inverter IV1 becomes a low level. Accordingly, the first NAND gate ND1 outputs a high-level signal regardless of the output signals of pins Pin<1:N>. In addition, the second NAND gate ND2 outputs a data signal obtained by inverting the data signal of pins Pin<1:N>. Therefore, the third NAND gate ND3 outputs a data signal obtained by inverting the output data signal of the second NAND gate ND2. As a result, the mirror function unit 100 outputs a data signal having the same logic level as that of output data signal of the mirror pins Pin<1(P):N(P)>. As a result, the output data signal of the mirror function unit 100 mirrors the output data signal of the mirror pins Pin<1(P):N(P)>. Accordingly, the boundary scan test circuit can perform boundary scan test by the mirror function unit 100 with respect to a bottom chip having pin arrangement corresponding to that of a top chip in the same scheme and sequence as those of the boundary scan test for the top chip.

When the mirror function is not performed, the mirror function enable signal "MF_Ctrl" becomes a low level resulting in the output data signal of the first inverter IV1 to become a high level.

Accordingly, the first NAND gate ND1 outputs an inverted signal of the output data signals of pins PIN<1:N>. Since the mirror function enable signal 'MF_Ctrl' becomes a low level, the second NAND gate ND2 outputs a high-level signal regardless of the output data signal of the mirror pins Pin<1 (P): N(P)>. Since the output of the second NAND gate ND2 becomes a high-level, the third NAND gate ND3 obtains an output signal by inverting the output data signal of the first NAND gate ND1. The output signal value of the third NAND gate ND3 has the same logic level as that of the output data signal of pins Pin<1:N>. As a result, the mirror function unit 100 transmits the output data of the pins Pin<1:N> when the mirror function enable signal 'MF_Ctrl' has a low level.

In the boundary scan test circuit and the test method thereof, semiconductor integrated circuits including top and bottom chips bonded to both surfaces of a memory board can be subject to a boundary scan test in the same scheme (sequence). Accordingly, a test control operation is simplified, test time can be reduced, and the user convenience can be improved when performing the test.

While certain embodiments have been described above, it will be understood that the embodiments are only for illustrative purposes. Accordingly, the systems and methods described herein should not be limited based on the described embodiments. Rather, the system and methods described herein should only be limited in light of the claims that follow when taken in conjunction with the above description and accompanying drawings.

What is claimed is:

1. A boundary scan test circuit for testing a top chip and a bottom chip mounted on a semiconductor memory device, the boundary scan test circuit comprising:
   a mirror function unit configured to output data of a first group of pins of a bottom chip or data of a second group of pins of the bottom chip according to a mirror function enable signal, wherein the second group of pins are pins of the bottom chip that receive and output data for a function that is identical to a function of pins of the top chip through a same line on a memory board; and
   a boundary scan test unit configured to receive data of the mirror function unit to perform a boundary scan test for the bottom chip in an order that is the same as that of a boundary scan test for the top chip.

2. The boundary scan test circuit of claim 1, wherein the first group of pins includes a first pin to an Nth pin, and the second group of pins includes a first mirror pin to an Nth mirror pin, and wherein the mirror function unit includes first to Nth mirror function units configured to output one of data corresponding to the first to Nth pin and data corresponding to a first mirror pin to an Nth mirror pin.

3. The boundary scan test circuit of claim 2, wherein the each of the mirror function unit includes:
 a first decoding unit for receiving an inverted signal of the mirror function enable signal and the data of the corresponding pin;
 a second decoding unit for receiving the mirror function enable signal and the data of the corresponding pin to perform an operation; and
 a third decoding unit for receiving output data of the first and second decoding units to perform an operation.

4. The boundary scan test circuit of claim 2, wherein the boundary scan test unit includes:
 a latch unit having first to Nth latch units, wherein the first latch unit receives a signal having a logic low level and output data of the first mirror function unit and wherein an nth latch unit receives output data of an (n−1)th flip-flop and the output data of the nth mirror function unit; and
 a transmission unit having first to Nth flip-flops, wherein an nth flip-flop receives output data of the nth latch unit (n is a natural number between 1 and N), wherein an (n+1)th latch unit receives output data of the nth flip-flop (n is a natural number not less than 1 and less than N), wherein output data of the Nth flip-flop are a scan output signal.

5. The boundary scan test circuit of claim 1, wherein the boundary scan test unit includes:
 a latch unit configured to receive, latch, and output data of the mirror function unit and output data of a transmission unit according to a control signal; and
 a transmission unit configured to receive output data of the latch unit and store and output the output data of the latch unit in synchronization with a clock.

6. The boundary scan test circuit of claim 1, wherein the boundary scan test unit is configured to receive output data of the mirror function unit in parallel and output the output data sequentially.

7. A boundary scan test method for a semiconductor integrated circuit including a top chip and a bottom chip mounted on both surfaces of a memory board, the boundary scan test method comprising:
 performing a boundary scan test for the top chip by sequentially testing output data of a third group of pins of the top chip when a mirror function enable signal is disabled; and
 performing a boundary scan test for the bottom chip by sequentially testing output data of a second group of pins corresponding to a first group of pins of the bottom chip when the mirror function enable signal is enabled,
 wherein the second group of pins are pins of the bottom chip that receive and output data for a function that is identical to a function of the third pins of the top chip, which are connected to the first group of pins through a same line on a memory board.

8. The boundary scan test method of claim 7, wherein the performing of the boundary scan test for the bottom chip includes:
 transmitting the output data of the second group of pins of the bottom chip among output data of the first group of pins of the bottom chip and the output data of the second group of pins of the bottom when the mirror function enable signal is enabled; and
 receiving the output data of the second group of pins of the bottom chip and sequentially outputting the output data of the second group of pins.

* * * * *